(12) United States Patent
Wang et al.

(10) Patent No.: US 9,964,596 B2
(45) Date of Patent: May 8, 2018

(54) INTEGRATED CIRCUIT WITH LOW POWER SCAN SYSTEM

(71) Applicant: FREESCALE SEMICONDUCTOR, INC., Austin, TX (US)

(72) Inventors: Ling Wang, Suzhou (CN);
Huangsheng Ding, Suzhou (CN);
Wanggen Zhang, Suzhou (CN)

(73) Assignee: NXP USA, INC., Austin, TX (US)

( * ) Notice: Subject to any disclaimer, the term of this patent is extended or adjusted under 35 U.S.C. 154(b) by 5 days.

(21) Appl. No.: 15/256,618

(22) Filed: Sep. 4, 2016

(65) Prior Publication Data

US 2017/0146599 A1    May 25, 2017

(30) Foreign Application Priority Data

Nov. 19, 2015 (CN) .......................... 2015 1 1035883

(51) Int. Cl.
*G01R 31/3185* (2006.01)

(52) U.S. Cl.
CPC ............... *G01R 31/318575* (2013.01); *G01R 31/318541* (2013.01)

(58) Field of Classification Search
None
See application file for complete search history.

(56) References Cited

U.S. PATENT DOCUMENTS

| 5,920,575 | A | * | 7/1999 | Gregor | G01R 31/318541 714/726 |
|---|---|---|---|---|---|
| 7,729,884 | B2 | * | 6/2010 | Huang | G01R 31/318547 702/185 |
| 7,779,320 | B2 | | 8/2010 | Chmelar | |
| 7,797,603 | B2 | | 9/2010 | Rajski | |
| 7,843,218 | B1 | * | 11/2010 | Ramaraju | G01R 31/318541 326/38 |
| 7,925,465 | B2 | | 4/2011 | Lin | |
| 8,332,698 | B2 | * | 12/2012 | Tang | G01R 31/318594 714/726 |
| 8,566,658 | B2 | | 10/2013 | Tekumalla | |
| 8,627,160 | B2 | | 1/2014 | Devta-Prasanna | |
| 2002/0035712 | A1 | | 3/2002 | Whetsel | |
| 2009/0256609 | A1 | * | 10/2009 | Naffziger | H03K 3/012 327/203 |
| 2012/0209556 | A1 | | 8/2012 | Rajski | |
| 2014/0040688 | A1 | | 2/2014 | Zhang | |

FOREIGN PATENT DOCUMENTS

WO         2013016989        2/2013

* cited by examiner

*Primary Examiner* — Mujtaba M Chaudry
(74) *Attorney, Agent, or Firm* — Charles E. Bergere (57) ABSTRACT

An integrated circuit operable in a scan mode includes a scan chain formed by cascaded flip-flop cells. Each flip-flop cell includes a master latch that receives a first data signal and generates a first latch signal, a slave latch that receives the first latch signal and generates a second latch signal, and a multiplexer having first and second inputs respectively connected to the master and slave latches for receiving a first input signal and the second latch signal, and generating a scan data output signal depending on a trig signal. The first input signal is one of the first data signal and the first latch signal. The clock signal provided to the slave latch is gated by the trig signal.

8 Claims, 6 Drawing Sheets

INTEGRATED CIRCUIT WITH LOW POWER SCAN SYSTEM

BACKGROUND

The present invention relates to testing integrated circuits (ICs) and, more particularly, to testing an integrated circuit with a low power scan system.

Figure 1:
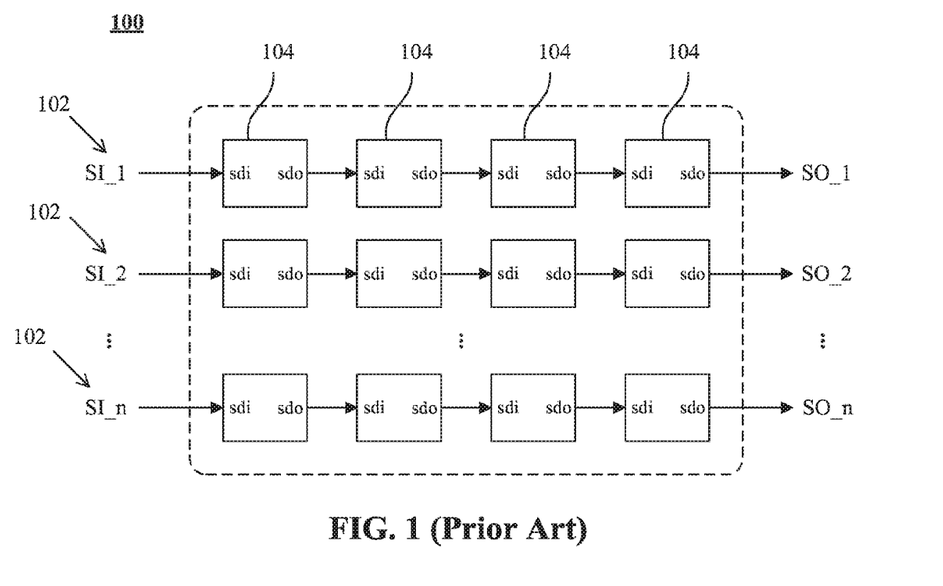
FIG. 1 is a schematic block diagram of a conventional scan test system formed by a plurality of conventional flip-flop cells.

Scan chains are widely used in integrated circuits (IC) to obtain access to internal nodes of an IC to simplify testing of the IC by passing test data through flip-flops of the IC. FIG. 1 is a schematic block diagram of a conventional scan system 100 including a plurality of scan chains 102 arranged in parallel to each other. Each scan chain 102 is formed by a plurality of cascaded conventional flip-flop cells 104.

Figure 2:
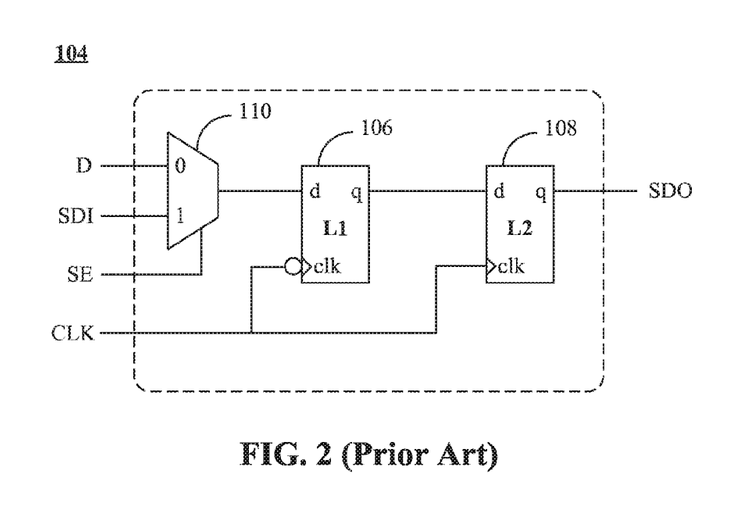
FIG. 2 is a schematic block diagram of a conventional flip-flop cell of FIG. 1.

FIG. 2 is a schematic block diagram of one of the flip-flop cells 104 of FIG. 1. The flip-flop cell 104 includes a master latch 106, a slave latch 108 having an input terminal connected to an output terminal of the master latch 106, and a multiplexer 110 having an output terminal connected to an input terminal of the master latch 106. The flip-flop cell 104 is configured to operate in one of two modes, functional mode and scan mode. The multiplexer receives a data input signal (D) and a scan data input signal (SDI), and generates a first data signal depending on a scan enable signal, which is active in the scan mode. A clock signal is provided to both the master and slave latches.

For a full scan design, during scan testing, all of the flip-flop cells 104 in the IC and all of the combinational logic cells connected to the flip-flop cells 104, may be toggling at the same time, causing very high power consumption. This high power consumption is much greater than the power consumption in normal functional mode where only some of the combinational logic and flip-flops are toggling, and such high power consumption may exceed the IC's power rating. Further, as IC chip density and speed increase, the scan shift power problem is exacerbated. Therefore, there is a need for providing a low power scan system.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an IC operable in a scan mode is provided. The IC includes at least one scan chain formed by a plurality of cascaded flip-flop cells that receive a scan input signal (SI), and output a scan output signal (SO). Each flip-flop cell includes a master latch that receives a first data signal and generates a first latch signal based on a clock signal, a slave latch, connected to the master latch, that receives the first latch signal and generates a second latch signal based on the clock signal, and a first multiplexer having first and second input terminals respectively connected to the master and slave latches for receiving a first input signal and the second latch signal, and generating a scan data output signal (SDO) depending on a trig signal. A first logic gate gates the clock signal provided to the slave latch with the trig signal. The first input signal is one of the first data signal and the first latch signal. The plurality of flip-flop cells include at least a first flip-flop cell that receives the scan input signal, and a last flip-flop cell that outputs the scan output signal.

In another embodiment, the present invention provides a method for performing a scan test on an IC, operable in a scan mode, that includes at least one scan chain formed by a plurality of cascaded flip-flop cells. The plurality of flip-flop cells include at least a first flip-flop cell for receiving an scan input signal, and a last flip-flop cell for outputting a scan output signal, and each flip-flop includes a master latch and a slave latch connected in series. The method includes: providing a clock signal to the plurality of flip-flop cells; providing the scan input signal to the scan chain through a scan data input terminal of the first flip-flop cell based on the clock signal; selecting a selected flip-flop cell from the plurality of flip-flop cells in each clock cycle of the clock signal; disabling and bypassing the slave latches of non-selected flip-flop cells in the chain; shifting the scan input signal to the selected flip-flop cell; and outputting data in the slave latch of the selected flip-flop cell as the scan output signal of the scan chain. The plurality of flip-flop cells are selected successively from the last flip-flop cell to the first flip-flop cell.

Figure 3:
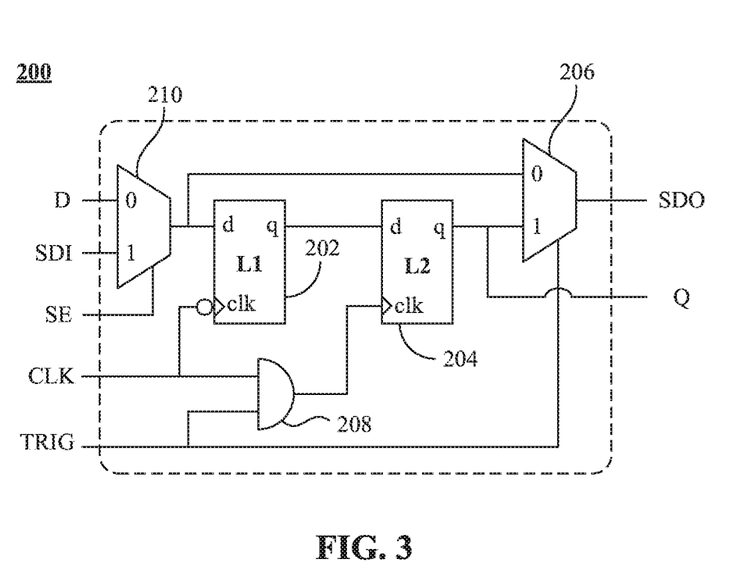
FIG. 3 is a schematic block diagram of a flip-flop cell in accordance with an embodiment of the present invention.

Referring now to FIG. 3, a schematic block diagram of a proposed flip-flop cell 200 operable in a scan mode in accordance with an embodiment of the present invention is shown. The flip-flop cell 200 includes a master latch 202 and a slave latch 204. The master latch 202 receives a first data signal at a data input terminal and a clock signal (CLK) at a clock input terminal, and generates a first latch signal at an output terminal based on a clock signal. The slave latch 204 has a data input terminal connected to the output terminal of the master latch 202. The slave latch 204 receives the first latch signal at the data input terminal and the clock signal at a clock input terminal, and generates a second latch signal at an output terminal based on the clock signal. In a preferred embodiment, the master latch 202 receives the first data signal and generates the first latch signal in a second half of each clock cycle, and the slave latch 204 receives the first latch signal and generates the second latch signal in a first half of a next clock cycle.

The flip-flop cell 200 also includes a first multiplexer 206 having a first input terminal connected to the data input terminal of the master latch 202 for receiving the first data signal, and a second input terminal connected to the output terminal of the slave latch 204 for receiving the second latch signal. The first multiplexer 206 generates a scan data output signal (SDO) depending on a trig signal (TRIG), such that both the master and slave latches 202 and 204 are bypassed depending on the trig signal. The flip-flop cell 200 further includes a first logic gate 208 that gates the clock signal provided to the slave latch 204 with the trig signal. In a preferred embodiment, the first logic gate 208 is an AND gate. In this manner, the trig signal is used to prevent unwanted power dissipation of the flip-flop cell 200.

In a preferred embodiment, the flip-flop cell 200 is operable in a functional mode and the scan mode. The flip-flop cell 200 further includes a second multiplexer 210 having first and second input terminals that respectively receive a data input signal (D) and a scan data input signal (SDI), and an output terminal connected to the data input terminal of the master latch 202. The second multiplexer 210 generates the first data signal depending on a scan enable signal (SE) that is active in the scan mode.

Figure 4:
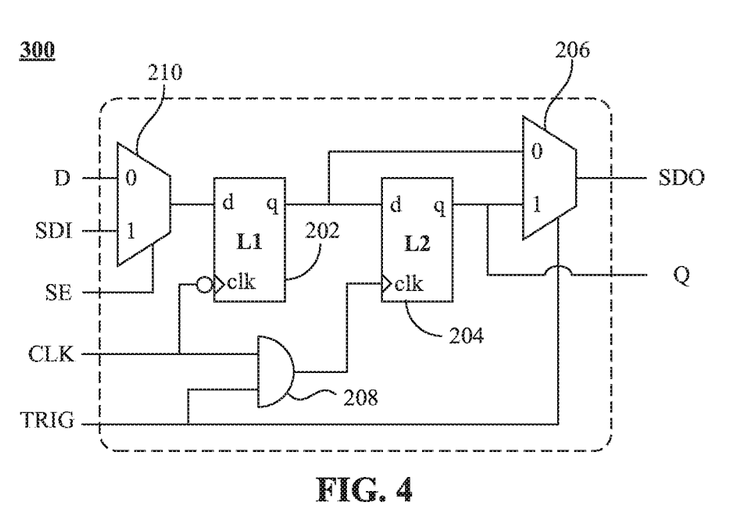
FIG. 4 is a schematic block diagram of a flip-flop cell in accordance with another embodiment of the present invention.

FIG. 4 is a schematic block diagram of a flip-flop cell 300, operable in the scan mode, in accordance with another embodiment of the present invention. The flip-flop cell 300 is substantially the same as the flip-flop cell 200 shown in FIG. 3 except that the first input terminal of the first multiplexer 206 is connected to the output terminal of the master latch 202 for receiving the first latch signal, such that the slave latch 204 is bypassed based on the trig signal.

Figure 5:
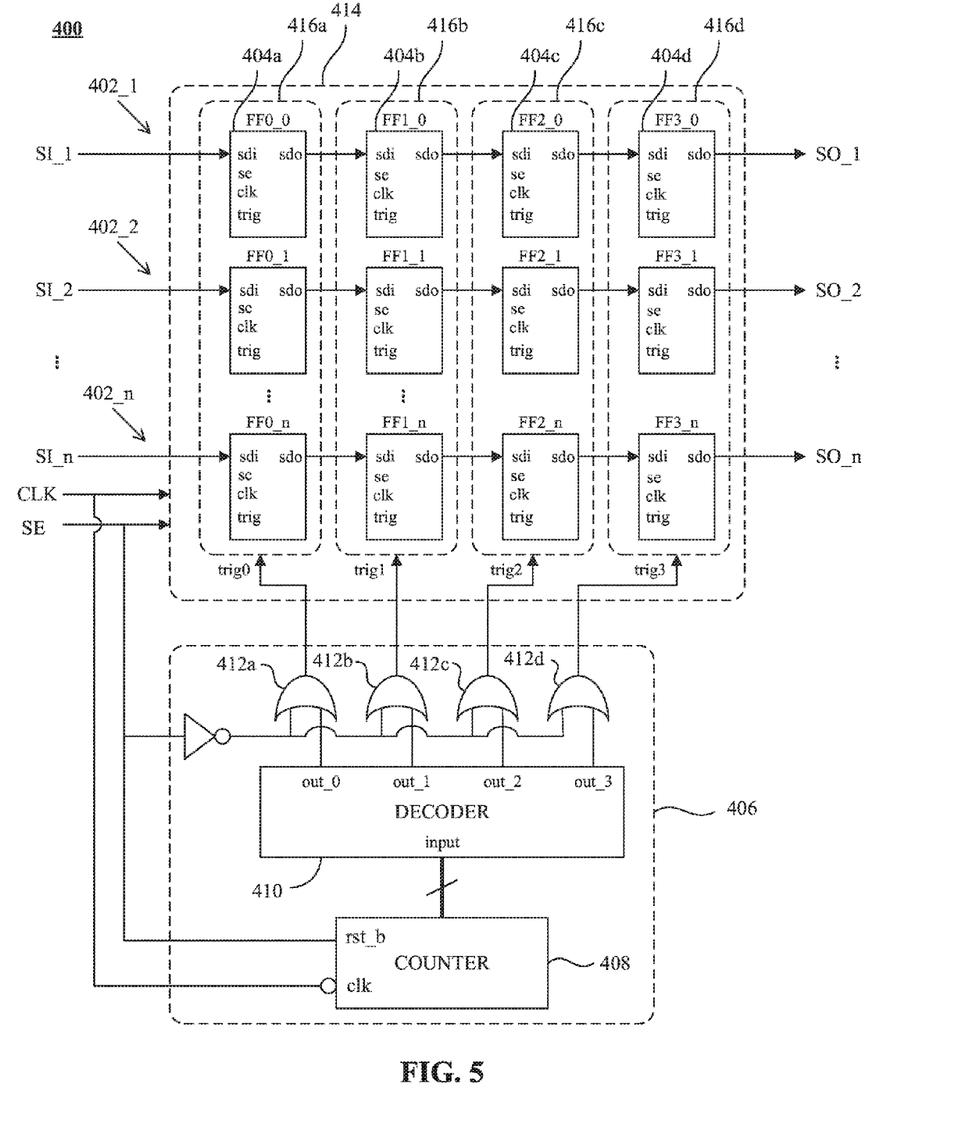
FIG. 5 is a schematic block diagram of an IC having a low power scan test system formed by a plurality of flip-flop cells in accordance with an embodiment of the present invention.

FIG. 5 is a schematic block diagram of an IC 400 with a low power scan test system formed by n scan chains 402_1~402_n, where n is a natural number, in accordance with an embodiment of the present invention. Each of the n scan chains 402_1~402_n receives a corresponding scan input signal (SI_i) at a corresponding scan input terminal of the scan chain, and output a corresponding scan output signal (SO_i) at a corresponding scan output terminal of the scan chain, where i is a natural number, and 1≤i≤n, and each scan chain includes m cascaded flip-flop cells, wherein m is a natural number, and m≥2. The m cascaded flip-flop cells in each scan chain include at least a first flip-flop cell that receives the scan input signal (SI_i), and a last flip-flop cell that outputs the scan output signal (SO_i). In a preferred embodiment, the flip-flop cells in FIG. 5 are the flip-flop cell 200 shown in FIG. 3. In another preferred embodiment, the flip-flop cells in FIG. 5 are the flip-flop cell 300 shown in FIG. 4. In the example shown in FIG. 5, the scan chain 402_1 is formed by four flip-flop cells 404a~404d, where the flip-flop cell 404a is the first flip-flop cell of the scan chain 402_1 that receives the scan input signal (SI_1), and the flip-flop cell 404d is the last flip-flop cell of the scan chain 402_1 that outputs the scan output signal (SO_1).

The IC 400 further includes a control unit 406 connected to the n scan chains 402_1~402_n and providing the trig signals to the flip-flop cells in each of the n scan chains 402_1~402_n, where the trig signal provided to each of the flip-flop cells in each of the n scan chains 402_1~402_n is successively asserted in the scan mode. In a preferred embodiment, the trig signal provided to each of the flip-flop cells in each scan chain is asserted successively from the trig signal to the last flip-flop cell of the scan chain to the trig signal to the first flip-flop cell of the scan chain.

The control unit 406 includes a counter 408 that receives the clock signal and generates a counting signal based on the clock signal. The counter 408 is reset by the scan enable signal in the functional mode. In a preferred embodiment, the counter 408 is triggered at a leading edge of a second half of each clock cycle. The control unit 406 further includes a decoder 410 connected to the counter 408 that receives the counting signal and generates a one-hot signal for successively asserting the trig signal to each of the flip-flop cell of a scan chain in the scan mode, and a plurality of second logic gates connected to the decoder 410, each for gating a corresponding bit of the one-hot signal based on the scan enable signal. In a preferred embodiment, the second logic gate includes an OR gate, and each bit of the one-hot signal is gated by an inverse scan enable signal. In the example shown in FIG. 5, the plurality of second logic gates includes first through fourth logic gates 412a~412d that respectively gate a corresponding bit of the one-hot signal generated by the decoder 410 with an inversed scan enable signal, and generates first through fourth trig signals trig0~trig3 respectively for the four flip-flop cells of each scan chain.

In a preferred embodiment, the n scan chains 402_1~402_n form an array 414 of the flip-flop cells. The array includes m columns of flip-flop cells including at least a first column formed by the first flip-flop cells of each of the n scan chains, and a last column formed by the last flip-flop cells of each of the n scan chains. In the example shown in FIG. 5, the array 414 of the flip-flop cells is formed by 4 columns 416a~416d of the flip-flop cells, where the column 416a is the first column and the column 416d is the last column. The flip-flop cells of each column share a common column trig signal provided by the control unit 406. The column trig signal of each of the columns is asserted successively from the column trig signal of the last column to the column trig signal of the first column in the scan mode.

Figure 6:
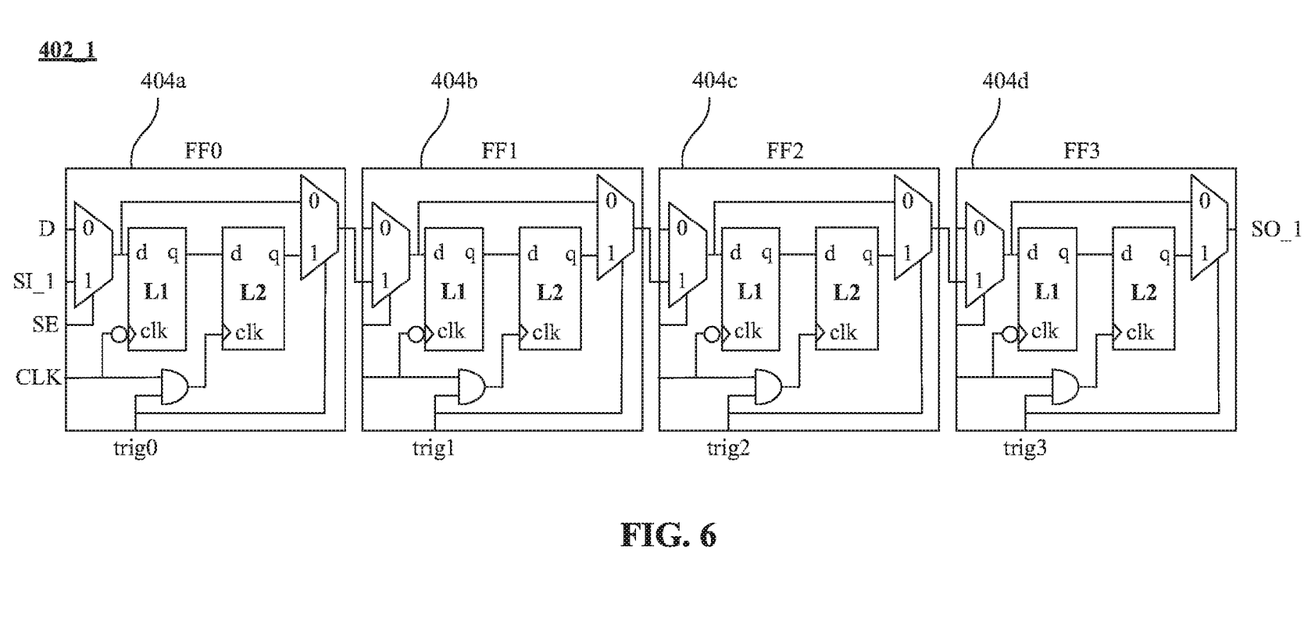
FIG. 6 is a schematic block diagram of a scan chain the IC of FIG. 5 formed by a plurality of the flip-flop cells of FIG. 3 in accordance with an embodiment of the present invention.

FIG. 6 is a schematic block diagram of the scan chain 402_1 of FIG. 5 formed by the flip-flop cells 404a~404d that each has a structure of the flip-flop cell 200 of FIG. 3 in accordance with an embodiment of the present invention. The scan data input terminal of the first flip-flop cell 404a receives the scan input signal SI_1 of the scan chain 402_1, and the scan data output terminal of the last flip-flop cell 404d outputs the scan output signal SO_1 of the scan chain 402_1. Each of the flip-flop cells 404a~404c has the scan data output terminal connected to the scan data input terminal of a next flip-flop cell. Each of the flip-flop cells 404a~404d receives a corresponding trig signal of the trig signals trig0~trig3.

Figure 7:
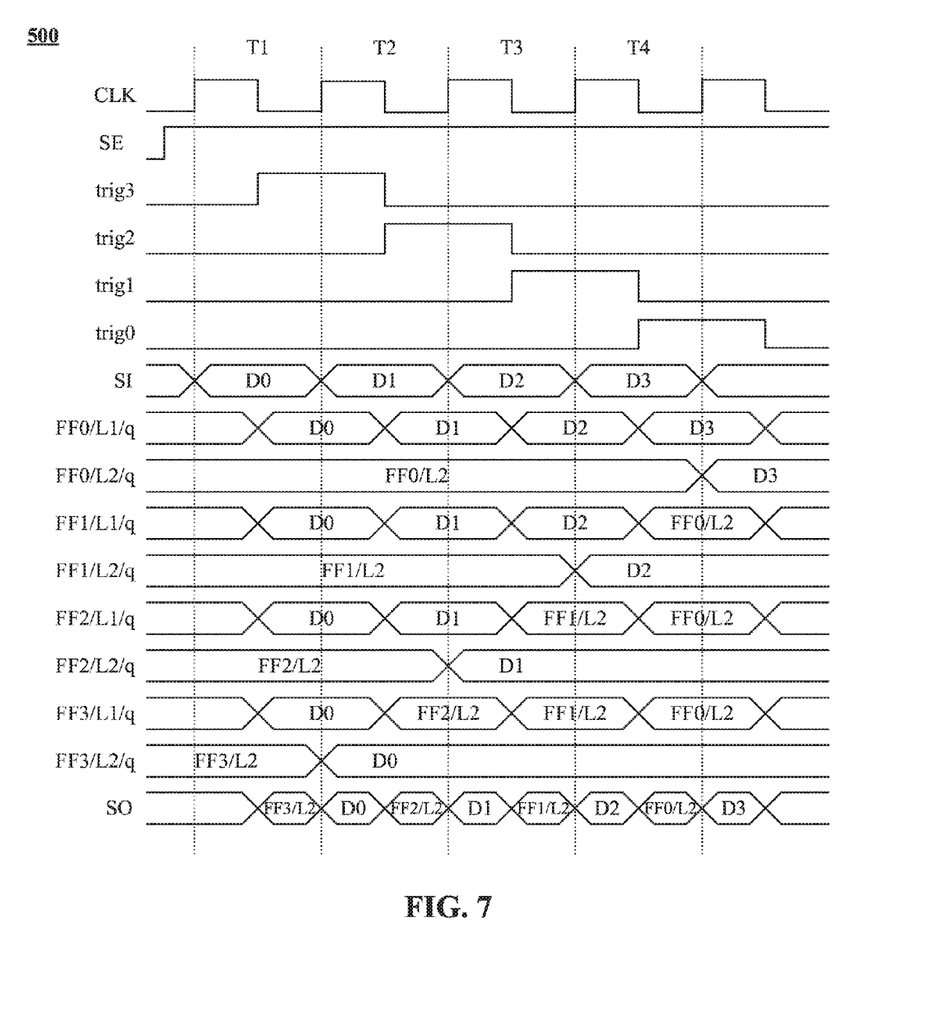
FIG. 7 is a timing diagram illustrating the cycles that are exercised during scan mode in accordance with an embodiment of the present invention.

FIG. 7 is a timing diagram illustrating the cycles that are exercised during the scan mode of the scan chain 402_1 of FIG. 6 in accordance with an embodiment of the present invention. The integrated circuit 400 is configured in the scan mode by asserting the scan enable signal. Each of the flip-flop cells 404a~404d is successively selected for one clock cycle of the clock signal by asserting the corresponding trig signal for one clock cycle of the clock signal starting from a leading edge of a second half of a corresponding clock cycle to a leading edge of a second half of a next clock cycle. The trig signals trig0~trig3 are asserted successively from the trig signal trig3 to the last flip-flop cell 404d to the trig signal trig 0 to the first flip-flop cell 404a. The scan input signal is provided to the scan chain 402_1 based on the clock signal. The master latch L1 of each flip-flop cell receives the first data signal and generates the first latch signal at an output q in a second half of each clock cycle, and the slave latch L2 of a selected flip-flop cell receives the first latch signal and generates the second latch signal at an output q in a first half of a next clock cycle. The slave latch of each non-selected flip-flop cell is bypassed and holds the second latch signal, such that the scan chain 402_1 outputs the second latch signal of the selected flip-flop cell in a second half of a corresponding clock cycle. In this manner, unwanted power dissipation of the non-selected flip-flop cells is prevented in the scan mode.

Figure 8:
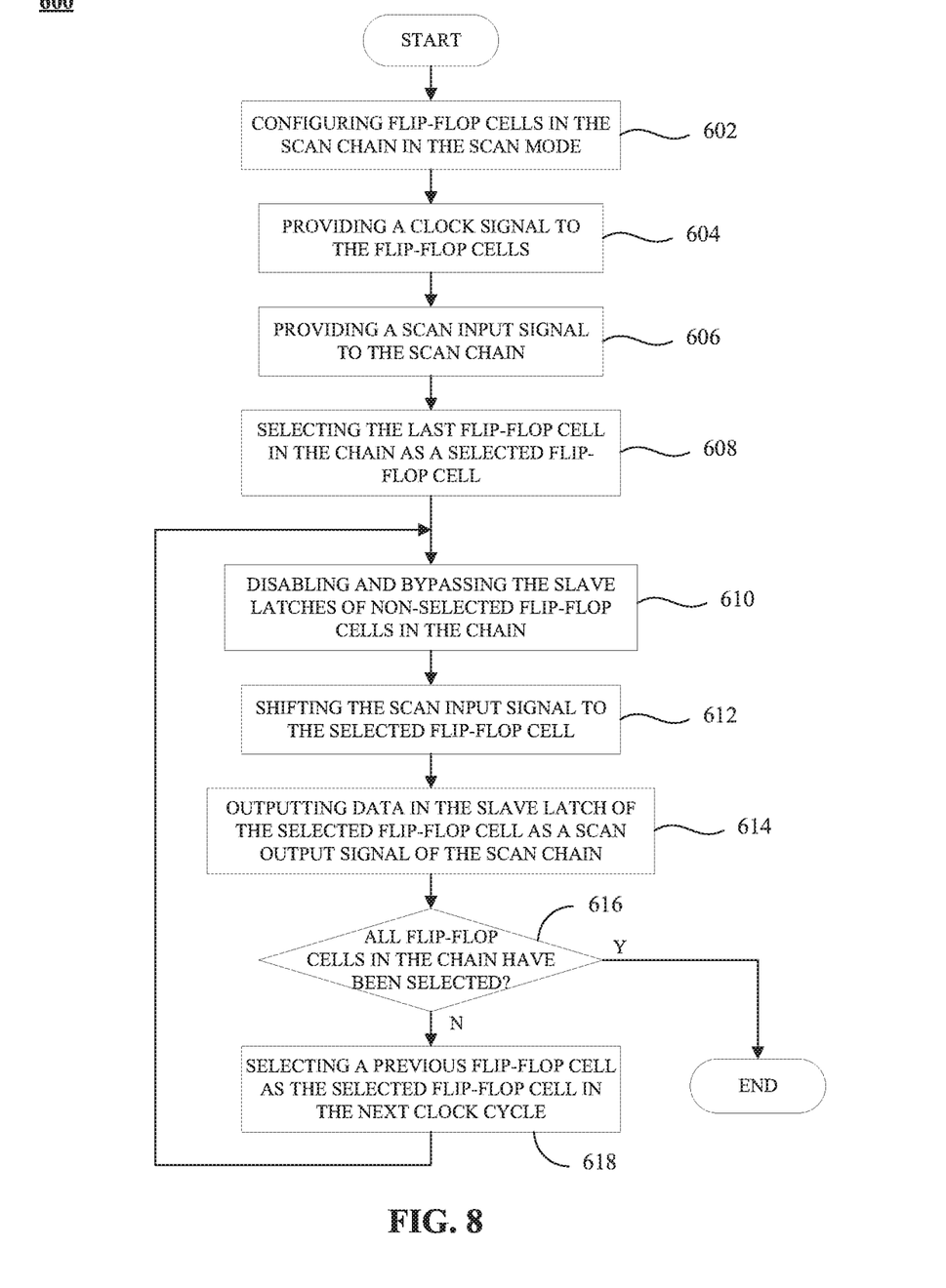
FIG. 8 is a flow chart of a low power scan method in accordance with one embodiment of the present invention.

Referring to FIG. 8, a flow chart 600 of a scan method performed on the IC 400 of FIG. 5 that includes at least one scan chain formed by a plurality of flip-flop cells in accordance with one embodiment of the present invention is shown. The at least one scan chain receives a scan input signal at a scan input terminal, and output a scan output signal at a scan output terminal. The plurality of flip-flop cells include at least a first flip-flop cell that receives the scan input signal, and a last flip-flop cell that outputs the scan output signal.

Starting at step 602, the flip-flop cells are configured in the scan mode by activating the scan enable signal. In a preferred embodiment, activating the scan enable signal includes setting the scan enable signal to logic high.

At step 604, the clock signal is provided to the flip-flop cells. In a preferred embodiment, step 604 can be performed before, after, or at the same time as step 602.

At step 606, the scan input signal is provided to the scan chain through the scan data input terminal of the first flip-flop cell based on the clock signal.

At step 608, at a first clock cycle, the last flip-flop cell is selected as a selected flip-flop cell by asserting the trig signal provided to the last flip-flop cell. The trig signals provided to the rest flip-flop cells in the scan chain that are non-selected flip-flop cells remain low. In a preferred embodiment, the trig signal provided to the selected flip-flop cell is asserted at a leading edge of a second half of a clock cycle, and lasts for one clock cycle.

At step 610, the slave latches of the non-selected flip-flop cells in the scan chain are disabled by gating the clock signal provided to the slave latches with the corresponding trig signals which are at logic low state, and bypassed by configuring the first multiplexers of the non-selected flip-flop cells with the corresponding trig signals.

At step 612, the scan input signal is shifted to the selected flip-flop cell bypassing at least the slave latches of the non-selected flip-flops located between the scan input terminal of the scan chain and the selected flip-flop cell, and at step 614 data in the slave latch of the selected flip-flop cell is output as the scan output signal of the scan chain bypassing at least the slave latches of the non-selected flip-flops located between the selected flip-flop cell and the scan output terminal of the scan chain. In a preferred embodiment, both the master and slave latches of each of the non-selected flip-flop cells are bypassed. Each of the slave latches of the non-selected flip-flop cells in the chain holds the data previously shifted to the each of the slave latches, such that unwanted power dissipation of the non-selected flip-flop cells is prevented in the scan. In a preferred embodiment, the scan output signal is read to verify the integrated circuit.

At step 616, if all the flip-flop cells in the scan chain have been selected (successively), scan is finished, otherwise, at step 618, a flip-flop cell located right before the selected flip-flop cell is selected as the flip-flop cell, the rest flip-flop cells in the scan chain are configured as the non-selected flip-flop cells based on the trig signals provided to the plurality of flip-flop cells in the scan chain, and then step 610 is executed again.

In a preferred embodiment, the IC 400 comprises a plurality of the scan chains that form an array of the flip-flop cells. The array comprises a plurality of columns of the flip-flop cells including at least a first column formed by the first flip-flop cells of the scan chains, and a last column formed by the last flip-flop cells of the scan chains. At each clock cycle, a corresponding column of flip-flop cells is selected as a selected column, and the slave latches of the flip-flop cells in non-selected columns in the array are disabled and bypassed. In a preferred embodiment, the columns in the array are successively selected from the last column to the first column.

While various embodiments of the present invention have been illustrated and described, it will be clear that the present invention is not limited to these embodiments only. Moreover, although certain signals are described as either high or low active, one of skill in the art will understand that circuitry can be designed as either high or low active, so specifying a logic state in the above examples is just for explanatory purposes and is not to limit the inventive concept of the invention. Numerous modifications, changes, variations, substitutions, and equivalents will be apparent to those skilled in the art, without departing from the spirit and scope of the present invention, as described in the claims.

The invention claimed is:

1. An integrated circuit operable in a functional mode and a scan mode, comprising:
  at least one scan chain formed by a plurality of cascaded flip-flop cells, wherein the scan chain receives a scan input signal (SI), and outputs a scan output signal (SO), and wherein each flip-flop cell comprises:
    a master latch that receives a first data signal and generates a first latch signal based on a clock signal;
    a slave latch, connected to the master latch, that receives the first latch signal and generates a second latch signal based on the clock signal;
    a first multiplexer having first and second input terminals respectively connected to the master and slave latches for receiving a first input signal and the second latch signal, and generating a scan data output signal (SDO) depending on a trig signal, wherein the first input signal is one of the first data signal and the first latch signal; and
    a first logic gate that gates the clock signal provided to the slave latch with the trig signal,
    wherein the plurality of flip-flop cells include at least a first flip-flop cell that receives the scan input signal, and a last flip-flop cell that outputs the scan output signal; and
  a control unit connected to the scan chain that successively asserts the trig signal to each of the plurality of flip-flop cells in the scan mode, wherein the control unit comprises:
    a counter that receives the clock signal and generates a counting signal based on the clock signal, wherein the counter is reset by a scan enable signal in the functional mode;
    a decoder connected to the counter that receives the counting signal and generates a one-hot signal for successively asserting the trig signal to each of the flip-flop cells in the scan chain in the scan mode; and a plurality of second logic gates connected to the decoder, each second logic gate for gating a corresponding bit of the one-hot signal based on the scan enable signal.

2. The integrated circuit of claim 1, wherein each flip-flop cell further comprises:
a second multiplexer, connected to the master latch, that receives a data input signal (D) and a scan data input signal (SDI), and generates the first data signal depending on the scan enable signal that is active in the scan mode.

3. The integrated circuit of claim 1, wherein the trig signal to each of the flip-flop cells is asserted successively from the trig signal to the last flip-flop cell to the trig signal to the first flip-flop cell.

4. The integrated circuit of claim 1, wherein the counter is triggered at a leading edge of a second half of each clock cycle.

5. The integrated circuit of claim 1, wherein the second logic gate comprises an OR gate, and each bit of the one-hot signal is gated by an inverse scan enable signal.

6. The integrated circuit of claim 3, wherein the at least one scan chain comprises a plurality of scan chains that form an array of the flip-flop cells, wherein the array comprises a plurality of columns of the flip-flop cells including at least a first column formed by the first flip-flop cells of each of the scan chains, and a last column formed by the last flip-flop cells of each of the scan chains, wherein the flip-flop cells of each column share a common column trig signal provided by the control unit, and wherein the column trig signal of each of the columns is asserted successively from the column trig signal of the last column to the column trig signal of the first column in the scan mode.

7. The integrated circuit of claim 1, wherein the first logic gate comprises an AND gate.

8. The integrated circuit of claim 1, wherein the master latch receives the first data signal and generates the first latch signal in a second half of each clock cycle, and the slave latch receives the first latch signal and generates the second latch signal in a first half of a next clock cycle.

* * * * *